(12) United States Patent
Belyi (10) Patent No.: US 6,300,836 B1
(45) Date of Patent: Oct. 9, 2001

(54) HIGH GAIN, WIDE BAND AMPLIFIER

(75) Inventor: Valeri Belyi, Moscow (RU)

(73) Assignee: Wolf Technologies Limited, Leicester (GB)

( * ) Notice: Subject to any disclaimer, the term of this patent is extended or adjusted under 35 U.S.C. 154(b) by 0 days.

(21) Appl. No.: 09/242,508

(22) PCT Filed: Aug. 13, 1997

(86) PCT No.: PCT/GB97/02210

§ 371 Date: Sep. 19, 2000

§ 102(e) Date: Sep. 19, 2000

(87) PCT Pub. No.: WO98/08301

PCT Pub. Date: Feb. 26, 1998

(30) Foreign Application Priority Data

Aug. 17, 1999 (RU) .................................................. 9617323

(51) Int. Cl.$^7$ ...................................................... H03F 3/04
(52) U.S. Cl. ................................................ 330/288; 330/257
(58) Field of Search .................................. 330/257, 288, 330/311

(56) References Cited

U.S. PATENT DOCUMENTS

| | | | |
|---|---|---|---|
| 4,420,725 | * 12/1983 | Sueyoshi et al. | 330/288 |
| 4,730,124 | * 3/1988 | Metz | 330/288 |
| 5,142,242 | * 8/1992 | Schaffer | 330/257 |
| 5,359,295 | * 10/1994 | Nishimura | 330/288 |
| 5,574,403 | * 11/1996 | Kolluri | 330/288 |

* cited by examiner

Primary Examiner—Robert Pascal
Assistant Examiner—Khanh Van Nguyen
(74) Attorney, Agent, or Firm—Kilpatrick Stockton LLP (57) ABSTRACT

An amplifier circuit comprising a basic amplifier which includes a first and a second transistor of opposite type in which the emitter terminal of the first transistor is connected to the input of the second transistor, and in which the collector terminal of the first transistor is connected to the emitter terminal of the second transistor to form a first current summing point, and a current mirror circuit connected to the first and second transistors to provide substantially equal collector current in each of the first and second transistors. The amplifier circuit includes a current source connected to said first current summing point to control the DC bias point of the first and second transistors. The amplifier may be adapted to a differential configuration using two basic amplifier circuits.

10 Claims, 6 Drawing Sheets

Fig. 6

HIGH GAIN, WIDE BAND AMPLIFIER

FIELD OF INVENTION

The present invention relates to amplifiers and more particularly to a high gain, wide band and linear amplifier suitable for bipolar transistors.

BACKGROUND OF INVENTION

For a wide band amplifier it is necessary to maximize the gain-bandwidth product. It is possible to obtain the desired gain by using several amplification stages. However, the linearity and the stability of the amplification factor will be low in this case. Both parameters may be improved by employing negative feedback. However, negative feedback in multistage amplifiers has an inherent high frequency stability problem. Moreover, the time delay of multistage amplifiers is equal to the sum of the time delays for each stage.

The present invention aims to provide an amplifier with high gain and low bandwith degradation.

Figure 1:
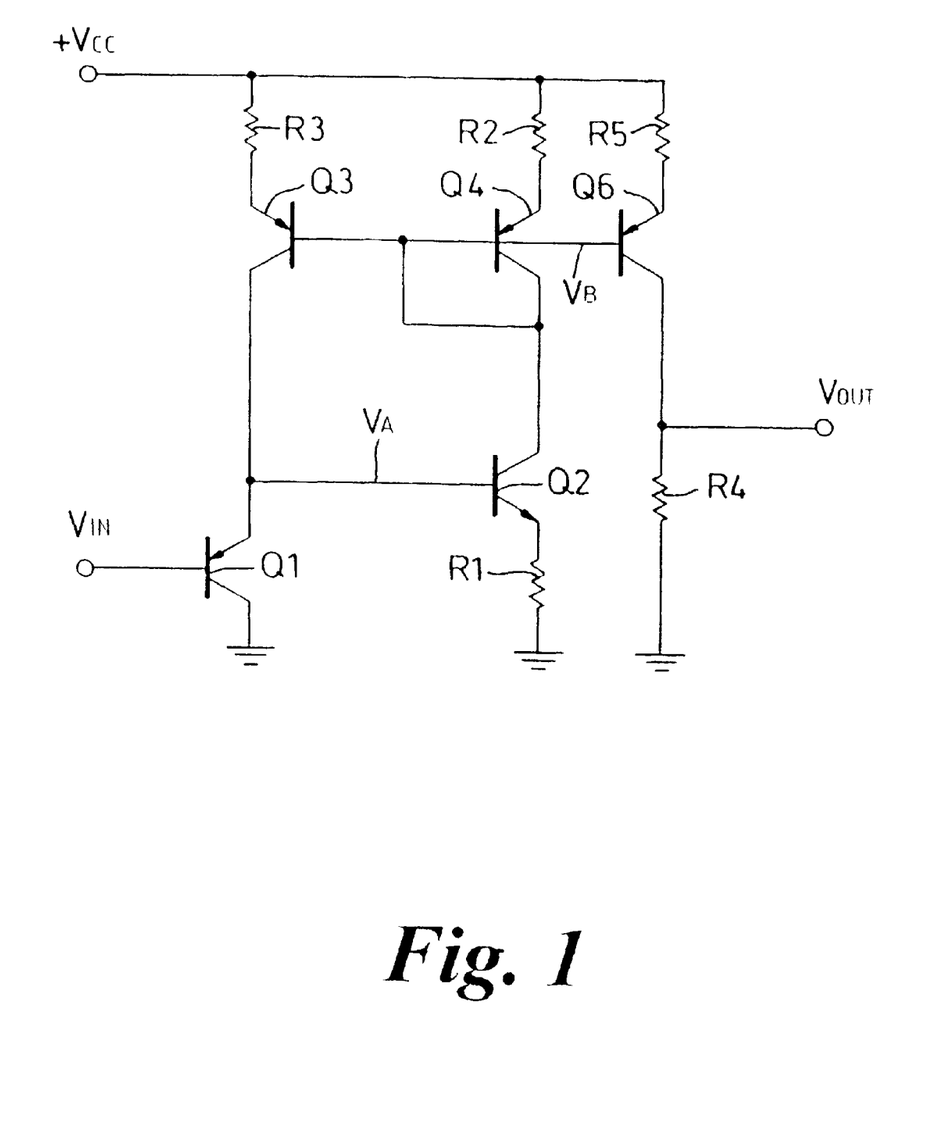
FIG. 1 shows an basic amplifier circuit according to the prior art.

A prior art basic amplifier circuit design is shown in FIG. 1. The basic amplifier circuit shown is formed by a PNP input transistor Q1, connected in an emitter follower configuration and coupled to the base of an NPN transistor Q2, connected in a common emitter configuration. A current mirror circuit takes a collector current of the transistor Q2 and passes equal currents to the emitter circuit of Q1 and to an output load resistance R4. A diode connected transistor Q4 provides for the receiving of the input current and transistors Q3 and Q6 provide the output currents. The resistances R2, R3 and R5 are current equalizing elements and are selected to be equal to one another. An emitter resistor R1 is connected in the emitter circuit of the transistor Q2.

The output, $V_{out}$, of this circuit has generally been described in the prior art by the equation:

$$V_{out}=(R4/R5)(R2/R1)V_{in}.$$

To increase the amplification of the circuit, the resistance R1 must be decreased toward zero. In practice, however, when this is done the amplification factor proves to be relatively low and non-linear distortion is not avoided. Moreover, the direct current bias point of the circuit will be indeterminate. This is for two reasons. Firstly, the current mirror circuit has relatively low accuracy so that the collector currents of transistors Q1 and Q2 are not equal, and secondly because even where such collector currents are equalized, there is an inequality in the base-emitter voltages of the two transistors Q1 and Q2, being of different types, PNP and NPN. Moreover, these voltages have opposite dependence during variations caused by the amplified signal.

SUMMARY OF INVENTION

The present invention aims to provide better performance by providing a direct current bias point control circuit and a stabilizing circuit to work in conjunction with the basic amplifier. The invention also aims to provide a differential amplifier configuration including a differential pair balancing circuit.

According to one aspect, the present invention provides an amplifier circuit comprising:
a basic amplifier including
  a first and a second transistor of opposite type in which the emitter terminal of the first transistor is connected to the input of the second transistor, and in which the collector terminal of the first transistor is connected to the emitter terminal of the second transistor to form a first current summing point, and
  a current mirror circuit connected to the first and second transistors to provide substantially equal collector currents in each of the first and second transistors; and
said amplifier circuit further including
  a current source connected to said first current summing point to control the DC bias point of the first and second transistors.

BRIEF DESCRIPTION OF DRAWING

Examples of the invention will now be described with reference to the accompanying drawings in which.

DETAILED DESCRIPTION OF PREFERRED EMBODIMENTS

Figure 2:
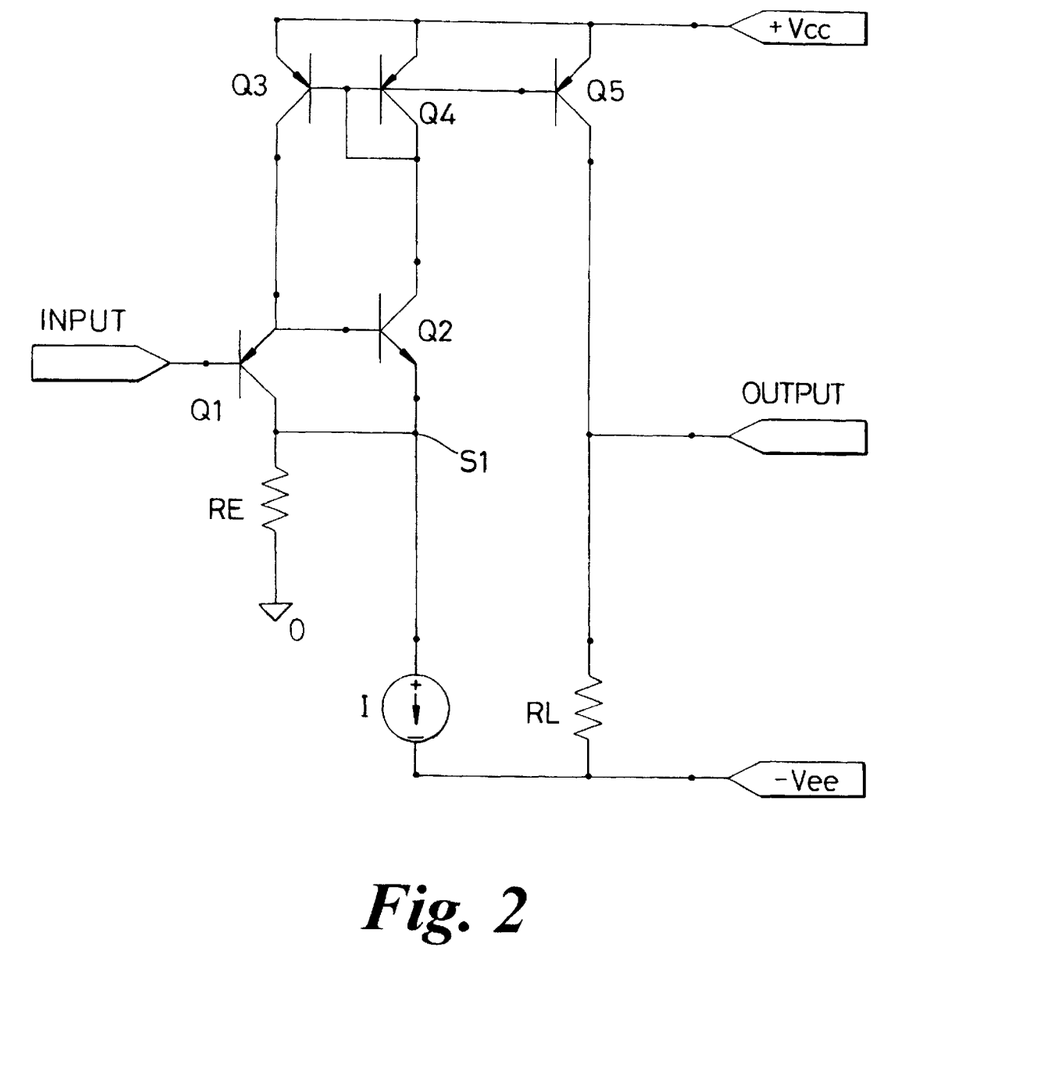
FIG. 2 shows a DC bias point control circuit used with the basic amplifier circuit of FIG. 1.

With reference to FIG. 2, there is shown a DC bias point control circuit. The DC bias point control circuit comprises a current source I supplying constant current to the collector circuit of the first transistor Q1 of the basic amplifier circuit (see FIG. 1) and to the emitter circuit of the second transistor Q2 of the basic amplifier circuit, which collector circuit and emitter circuit are coupled together at a current summing point S1.

An emitter load resistor RE of the combined circuit is connected between the current summing point S1 and the circuit ground, 0. The current source I ensures control of the DC bias point of the combined circuit independent of the value of the emitter load resistor RE and the DC component of the input voltage, INPUT, to the amplifier circuit. The current source I works in addition to any basic amplifier circuit which is provided.

Broadly speaking, there are two important differences between the circuit of FIG. 2 and the basic amplifier circuit of FIG. 1.

The first difference is that the negative power supply voltage—Vee and a current source I are added. The load resistance RL of the circuit is connected between the collector of Q5 and the negative power supply. Thus, the circuit may provide zero potential difference between the input and output terminals. The current source I determines the sum of the currents through transistors Q1 and Q2. Thus, the current source I substantially controls the DC bias point of the amplifier circuit while resistance RE substantially controls the gain of the amplifier circuit.

The second difference has the aim of making the collector-emitter voltage of the transistor Q1 constant. The collector of transistor Q1 is connected to the emitter of transistor Q2 at the current summing point S1 so that the collector-emitter voltage of Q1 is controlled by the relatively constant base-emitter voltage of the transistor Q2. Thus the voltage variations from the signal being amplified have no influence on the collector-emitter voltage of transistor Q1 and, therefore, no influence on the difference of the collector currents of transistors Q1 and Q2.

Figure 3:
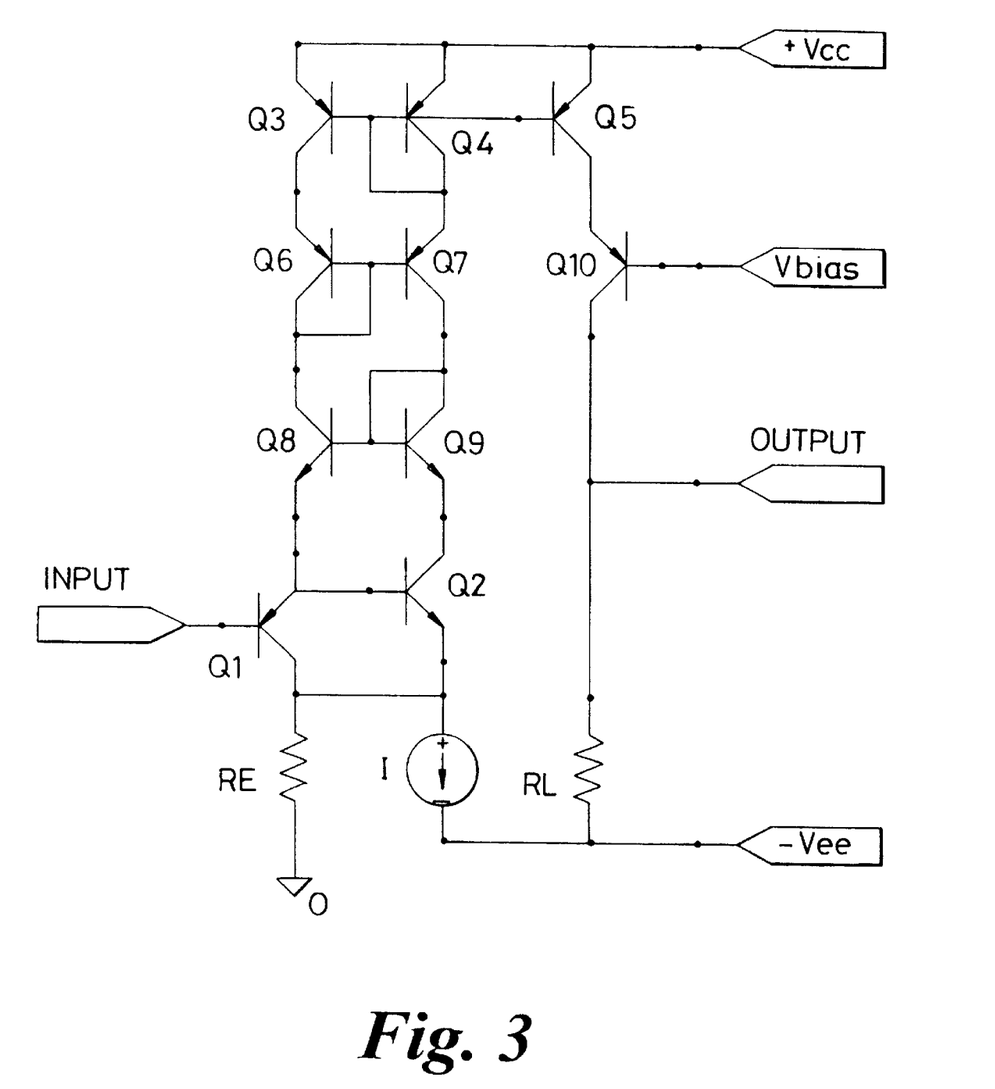
FIG. 3 shows a stabilization circuit used in conjunction with the basic amplifier circuit and DC bias point control circuit of FIG. 2.

With reference to FIG. 3, there is shown a stabilizing circuit for the circuit of FIG. 2. The stabilizing circuit comprises additional transistors Q6 to Q9 which ensure the stabilization of the collector-emitter voltages of the key transistors Q1 to Q4 of the circuit and, in particular, ensure independence of the currents flowing through the first and second transistors Q1 and Q2 of the basic amplifier circuit from the voltage variations caused by the signal being amplified. The transistors with this function can be an integral part of a precision current mirror and of its cascode connected output circuit.

The stabilization circuit includes a PNP pair and an NPN pair of stabilising transistors Q6,Q7 and Q8,Q9, respectively, controlling the base-collector voltages of the transistors Q3 and Q2 respectively. The bases of the stabilising PNP transistors Q6, Q7 are connected to one another and to the left hand current path (supplying the input transistor Q1) as shown, while the bases of the stabilizing NPN transistors Q8, Q9 are connected to one another and to the right hand current path (supplying the transistor Q2) as shown. The bases can alternately be connected to the right and left hand current paths respectively. It is in any case preferable, to achieve optimum current balance, to ensure that the bases of the PNP pair and of the NPN pair are supplied from opposite current paths.

The stabilization transistors assist the equalization of the base to collector voltages of the transistors Q2 and Q3 by utilizing the relative stability of the base-emitter voltages of Q8, Q9 and of Q6, Q7. For example, the collector-emitter voltage of Q2 is determined by the difference $V_{be8} - V_{be9}$, which is approximately zero, and by $V_{be}$ of Q2 which is relatively constant. Thus, $V_{ce2} = V_{be2}$ and $V_{be2}$ is constant, so $V_{ce2}$ is approximately constant. The situation is the same for transistor Q3, by virtue of the analogous action of transistors Q6 and Q7.

This stabilization is desirable to minimize the influence of the dependence of the collector current and $V_{ce}$ of the transistors Q2 and Q3 on the desirable quality of the base-emitter voltages in the circuit ($V_{be1}$ must be equal to $V_{be2}$ and $V_{be3}$ must be equal to $V_{be4}$).

The four transistors Q3, Q4, Q6 and Q7 may be regarded as a precision current mirror circuit. The addition of transistor Q10 serves to stabilize the collector-emitter voltage of transistor Q5 in the third branch of the current mirror circuit. The stabilization of the collector-emitter voltages provides the dependence of the collector currents only on the base-emitter voltages of the key transistors of the amplifier circuit.

A differential configuration of two basic amplifier circuits, as described with reference to FIGS. 2 and 3, can be provided using either two identical amplifier circuits or two complementary amplifier circuits, one a mirror image of the other.

Figure 4:
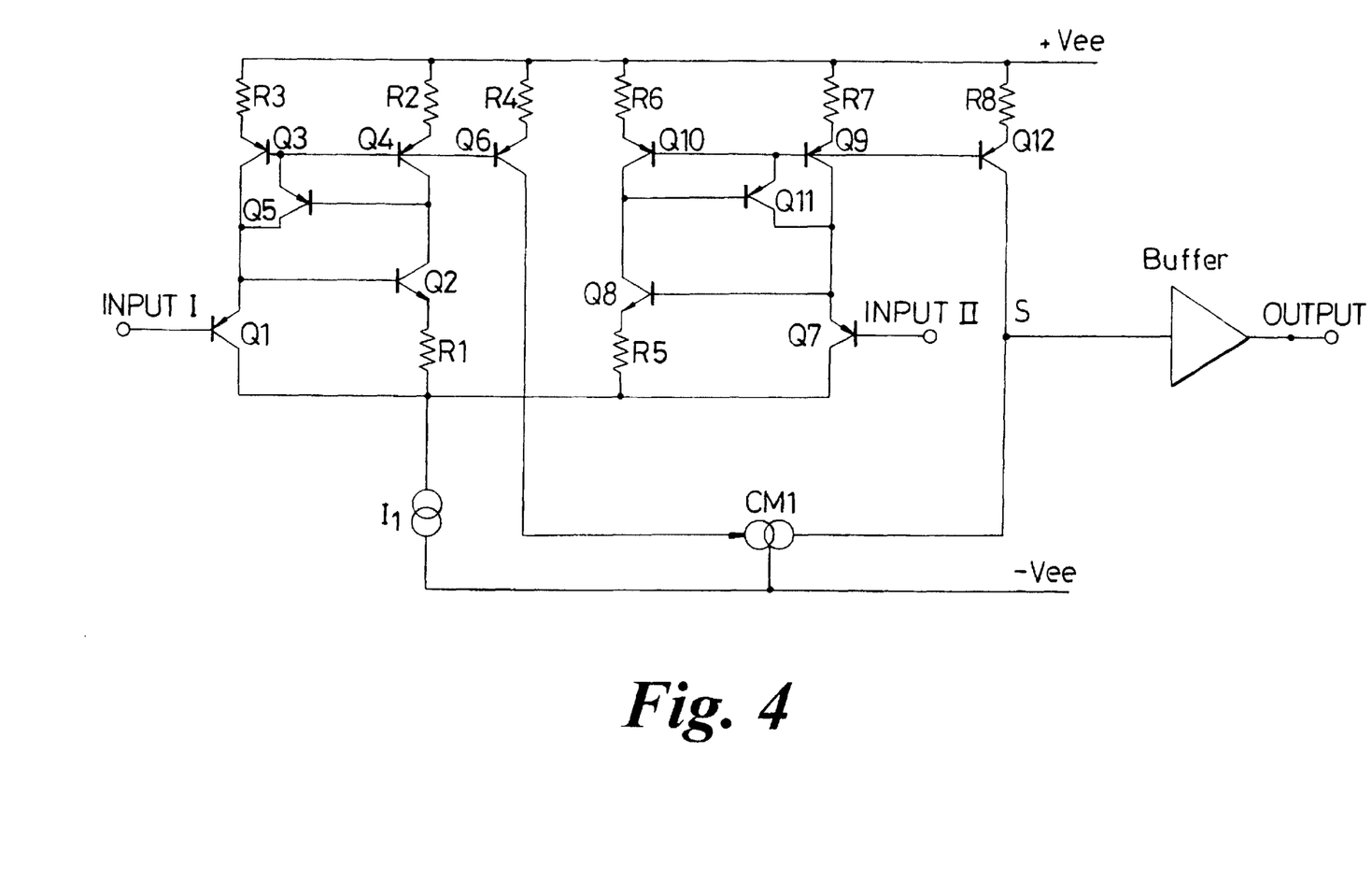
FIG. 4 shows a differential configuration of amplifier using the circuit of FIG. 2.

With reference to FIG. 4, a differential configuration of two identical basic amplifier circuits is provided. When the basic amplifier circuits are each balanced, the emitter output loads, R1 and R5, may be very close to or equal to zero. Since the gain of the combined circuit is inversely proportional to these loads, the gain is greatly increased.

The gain of the circuit is proportional to the output load impedance. The differential configuration provides the possibility of the realization of a high impedance output point, S. If the circuit is required to be connected to a low impedance external load, a wide band buffer circuit with a high input impedance and a low output impedance may be used to connect the circuits without the low input impedance affecting the high gain achieved.

The amplifier of FIG. 4 comprises a first Input I connected to a first amplifier circuit and a second Input II connected to a mirror image of the first amplifier circuit. The DC bias point of both amplifiers is controlled by the current source $I_1$. The outputs of the individual amplifier circuits are connected together through a current mirror circuit CM1. A high impedance output load of the combined circuit is provided at voltage gain node S which provides an intermediate output. The intermediate output S is connected through a buffer to a low impedance output terminal, which provides a final output.

By making the emitter loads R1, R5 of transistors Q2 and Q8 very close to or equal to zero, the gain of the combined circuit, which is inversely proportional to the value of those loads, is made very high. This, combined with a high output load impedance of the circuit at the node S, provides a very high gain.

Figure 5:
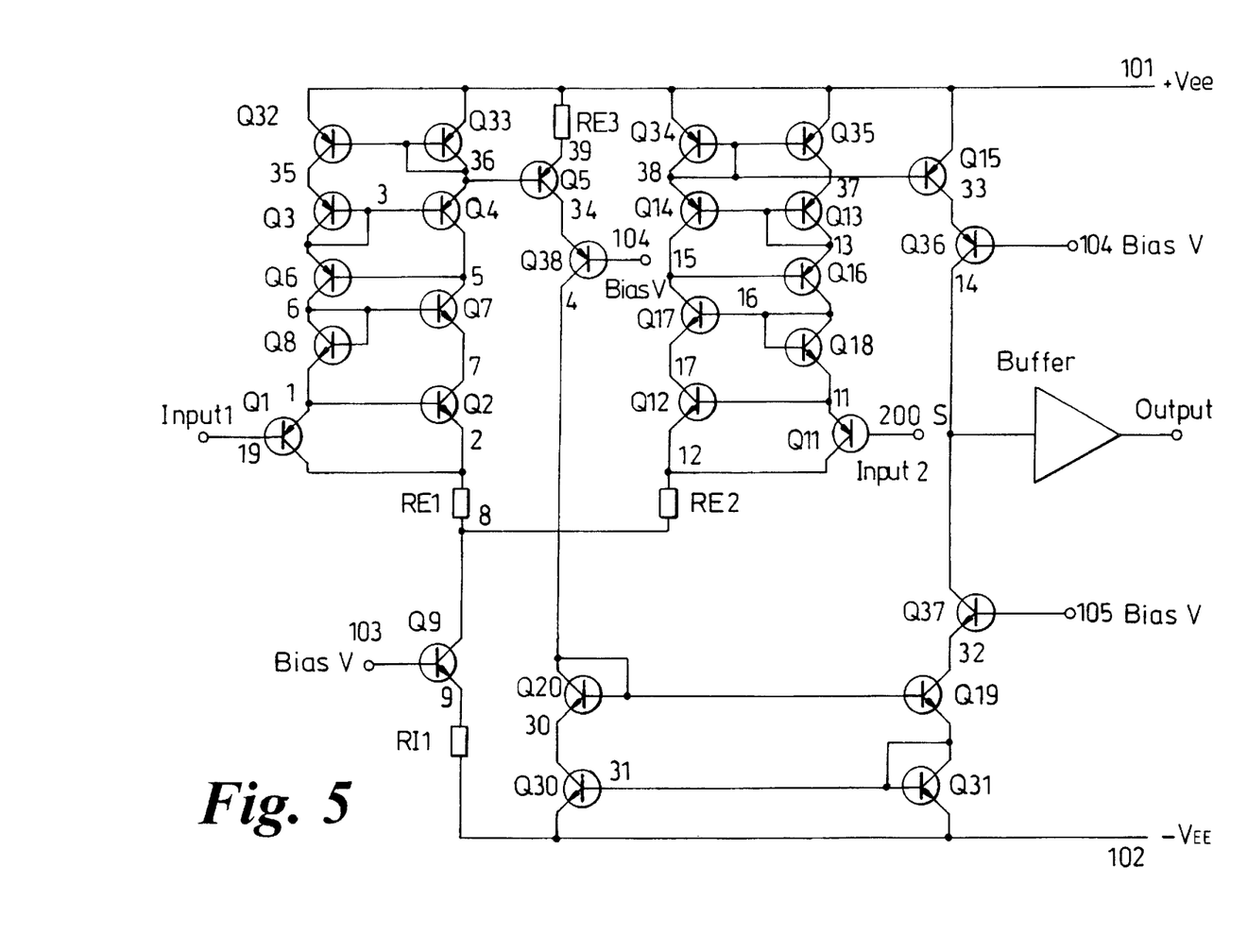
FIG. 5 shows a differential configuration of amplifier using the circuit of FIG. 3 in slightly modified form.

FIG. 5 shows a similar arrangement of the differential amplifier. The upper portions Q3, Q4, Q32, Q33 and Q13, Q14, Q34, Q35 of each amplifier stage constitute a precision current mirror as previously described. The current mirror configuration provides independence of the currents from the voltage variations caused by variations of the input signal being amplified, and a good balance of base currents in the branches of the current mirrors. The transistors Q6 and Q16 may be added to the current mirror circuit for better base current balance of the amplifier circuits. It will be understood that the transistor Q6 could equally be placed in the current path supplying transistor Q2, with its base current being drawn from the current path of transistor Q1 if, for example, the base current of transistor Q5 were to be drawn from the current path of transistor Q1, or for any other considerations affecting respective current gains of the transistors in the circuit.

Between the basic amplifier transistor pairs Q1, Q2; Q11, Q12 and the respective current mirror circuits, stabilizing circuits are added as described in connection with FIG. 3. The base-emitter voltages of transistor Q7 and Q8 are approximately equal, so the collector-emitter voltages of transistors Q1 and Q2 are approximately equal too. The currents through transistors Q1 and Q2 become independent of the voltage variations caused by the variations in the input signal being amplified. The function of transistors Q17 and Q18 in the right hand portion of FIG. 5 is similar.

In place of transistors Q6 and Q12 in FIG. 4, pairs of transistors Q5 and Q38, and Q15 and Q36, are provided in cascode configuration as discussed in connection with FIG. 3. The second transistor of each pair has a bias voltage applied and the outputs of the transistor pairs provide the outputs of the basic amplifier circuits. These outputs are connected together through a further current mirror constituted by transistors Q19, Q20, Q30 and Q31. A summing point S provides a high impedance output load for both basic amplifiers. The summing point S is connected to the final low impedance output terminal OUTPUT through a wide band buffer with a high input impedance and a low output impedance. As before, the low impedance of the emitter loads RE1 and RE2, or their close equality to zero, and the high impedance loads provide the very high gain.

Figure 6:
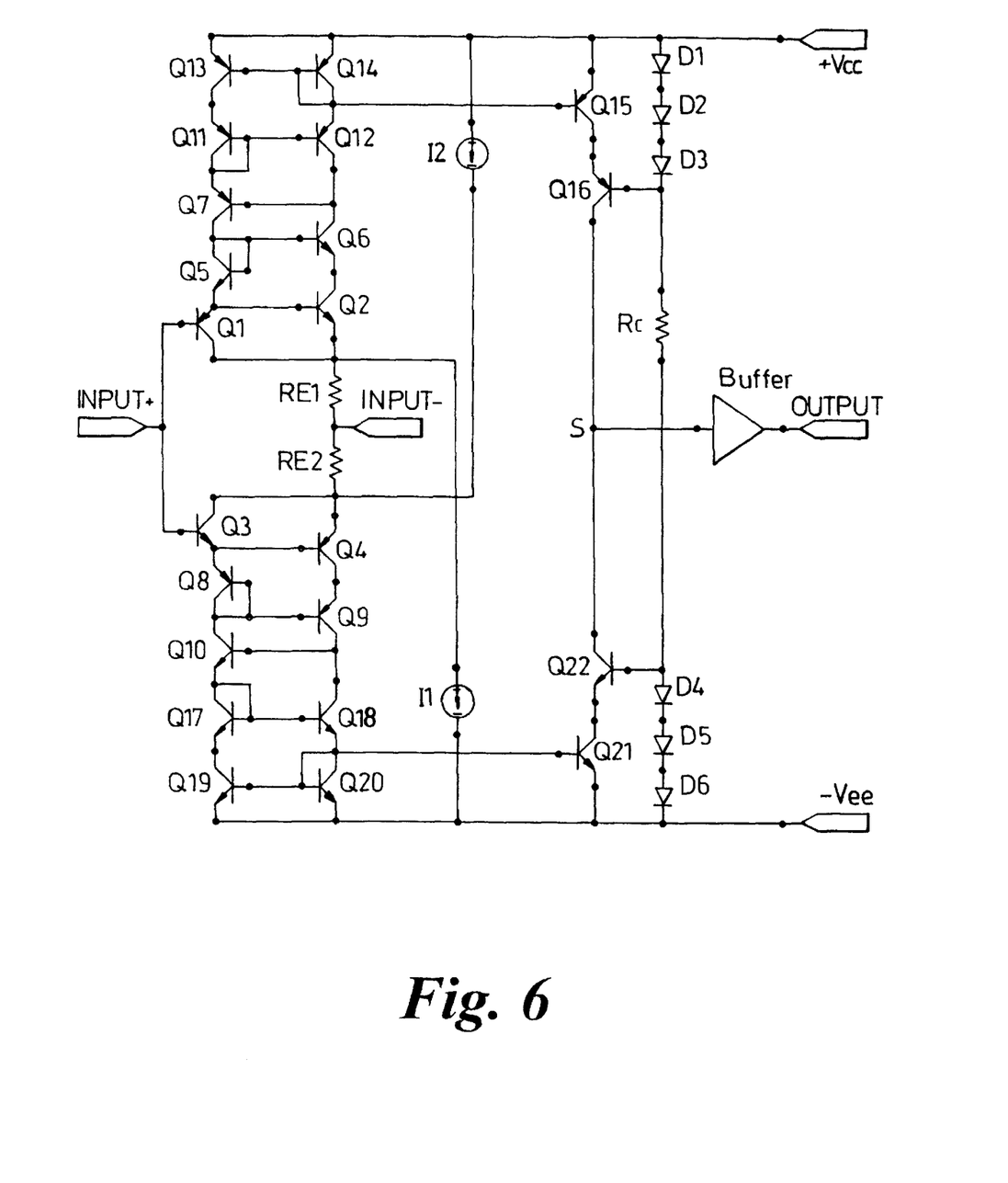
FIG. 6 shows another differential configuration of amplifier using the circuit of FIG. 3 in slightly modified form.

In FIG. 6, two inputs are provided, connected to the junctions between two balanced amplifier stages. The inputs are therefore applied non-symmetrically to two complementary mirror image circuits. In this case, however, the input I+ is a high impedance input and the input I− is a low impedance input. The transistor stages furthest from the inputs constitute precision current mirrors, as in the other embodiments. Separate current mirrors, corresponding to transistors Q19, Q20, Q30 and Q31 in FIG. 5, are not provided. Instead, the output stages of transistor pairs Q15 and Q16, and Q21 and Q22, are connected directly to the high impedance intermediate output terminal S which is connected through a buffer to a low impedance final output terminal, OUTPUT. Transistor pairs Q5, Q6 and Q8, Q9 operate as described for FIG. 3.

Better DC bias point control is provided by way of two current sources I1 and I2, which operate as previously described in connection with FIG. 2.

In summary, invention thus described includes a basic amplifier circuit comprising a pair of opposite type transistors, the first transistor being arranged as an emitter follower and the second transistor, the base of which is connected to the emitter of the first transistor, being arranged as a common emitter amplifier. The collector of the first transistor is connected to the emitter of the second transistor at a first current summing point and this summing point is connected to a current source which controls the DC bias point of the basic amplifier circuit. The output circuits of the transistor pair are connected to a precision current mirror circuit and a stabilizing circuit to provide equal collector currents through the two transistors of the basic amplifier circuit. The amplifier circuit has an emitter load of low impedance or zero load impedance.

The precision current mirror circuit takes the output current of the second transistor and supplies equal currents to the output circuit of the first transistor of the pair and to the output circuit of the basic amplifier circuit.

The stabilizing circuit preferably comprises a pair of transistors of the same type as the second transistor. One transistor of the pair is diode connected, bases of the transistors of the stabilizing circuit are connected together and the stabilizing circuit transistors are respectively connected between the output circuits of the first and second transistors and the precision current mirror circuit.

Two basic amplifier circuits may be arranged as a symmetrical or non-symmetrical differential configuration, comprising two differential inputs and an output circuit adapted to provide a high impedance output load to both basic amplifier circuits.

The symmetrical differential configuration comprises two identical basic amplifier circuits with two symmetrical differential inputs, a current source controlling the DC bias point of both differential branches, a further current mirror arranged to provide, in conjunction with the output circuits of each basic amplifier circuit, a high impedance output load to both of the basic amplifier circuits.

The non-symmetrical differential configuration comprises two complementary basic amplifier circuits with two non-symmetrical differential inputs, two current sources controlling the DC bias points of the differential branches, and a high impedance summing point where the two complementary output circuits of each basic amplifier are connected together. At this summing point, a high impedance output load is provided to both the basic amplifier circuits. The output circuit may comprises a buffer to match the high impedance output load of the differential amplifier to a low impedance external output load.

What is claimed is:
1. An amplifier circuit comprising:
   a basic amplifier including
   a first and a second transistor of opposite type in which the emitter terminal of the first transistor is connected to the input of the second transistor, and in which the collector terminal of the first transistor is connected to the emitter terminal of the second transistor to form a first current summing point, and
   a current mirror circuit connected to the first and second transistors and to a first supply voltage terminal to provide substantially equal collector currents in each of the first and second transistors; and
   a constant current source connected between said first current summing point and a second supply voltage terminal to control the DC bias point of the first and second transistors, so as to control, in use, the DC bias point of the amplifier circuit independent of any emitter load of the second transistor.

2. An amplifier circuit according to claim 1 in which the current source is adapted to establish said DC bias point of the first and second transistors when the emitter load of said second transistor is reduced to approximately zero.

3. An amplifier circuit according to claim 1 further including a stabilizing circuit between the current mirror circuit and the first and second transistors, the stabilizing circuit comprising a pair of stabilizing transistors of the same type as the second transistor, whose bases are coupled together and whose emitters are respectively coupled to the emitter and collector terminals of the first and second transistors, one of said pair of stabilizing transistors being diode connected, said stabilizing circuit thereby stabilizing the collector-emitter voltage of the second transistor.

4. An amplifier circuit according to claim 1 in which the current mirror circuit further includes an output transistor stage adapted to provide a current, substantially equal to said collector currents, to an output circuit of said basic amplifier.

5. An amplifier circuit according to claim 4 further including:
   a second basic amplifier comprising
   a third and a fourth transistor respectively of corresponding type to said first and second transistors, in which the emitter terminal of the third transistor is connected to the input of the fourth transistor, and in which the collector terminal of the third transistor is connected to the emitter terminal of the fourth transistor and to said first current summing point,
   a second current mirror circuit connected to the third and fourth transistors to provide substantially equal collector currents in each of the third and fourth transistors, and a substantially equal current to an output circuit of the second basic amplifier;
   said current source connected to said first current summing point also controlling the DC bias point of the third and fourth transistors of the second basic amplifier; and
   the inputs of the first and third transistors thereby forming a pair of balanced input terminals of a differential amplifier.

6. An amplifier circuit according to claim 5 further including a balanced output circuit adapted to provide a high impedance output.

7. An amplifier circuit according to claim 6 in which the balanced output circuit further includes a third current mirror arranged between the outputs of the first and second basic amplifiers.

8. An amplifier circuit according to claim 4 further including:

a second basic amplifier comprising a third and a fourth transistor respectively of opposite type to said first and second transistors, in which the emitter terminal of the third transistor is connected to the input of the fourth transistor, and in which the collector terminal of the third transistor is connected to the emitter terminal of the fourth transistor at a second current summing point, a second current mirror circuit connected to the third and fourth transistors to provide substantially equal collector currents in each of the third and fourth transistors, and a substantially equal current to an output circuit of the second basic amplifier;

a second current source connected to said second current summing point to control the DC bias point of the third and fourth transistors; and the inputs of the first and third transistors thereby forming a high impedance input terminal of a differential amplifier and the first and second current summing points being connected to form a low impedance input terminal of the differential amplifier.

9. An amplifier circuit according to claim 8 further including a balanced output circuit adapted to provide a high impedance intermediate output.

10. An amplifier circuit according to claim 9 in which the balanced output circuit further includes a buffer circuit coupled to said high impedance intermediate output to convert said high impedance intermediate output to a low impedance final output.

* * * * *